United States Patent [19]
Chen et al.

[11] Patent Number: 5,371,410
[45] Date of Patent: Dec. 6, 1994

[54] INTEGRATED CIRCUIT METALLIZATION WITH ZERO CONTACT ENCLOSURE REQUIREMENTS

[75] Inventors: Fusen E. Chen, Dallas; Fu-Tai Liou, Carrollton, both of Tex.

[73] Assignee: SGS-Thomson Microelectronics, Inc., Carrollton, Tex.

[21] Appl. No.: 90,294

[22] Filed: Jul. 12, 1993

Related U.S. Application Data

[62] Division of Ser. No. 676,084, Mar. 27, 1991, Pat. No. 5,270,254.

[51] Int. Cl.$^5$ .................. H01L 23/48; H01L 29/46
[52] U.S. Cl. ..................... 257/750; 257/751; 257/765; 156/656; 156/659.1
[58] Field of Search .......... 437/190, 192, 193, 194, 437/198, 199, 203, 228, 233, 238, 245; 156/643, 652, 656, 657, 659.1, 661.1, 662, 665; 257/734, 740, 751, 753, 758, 763, 764, 765, 750

[56] References Cited

U.S. PATENT DOCUMENTS

| | | | |
|---|---|---|---|
| 3,801,880 | 4/1974 | Harada et al. | 437/180 |
| 4,454,166 | 6/1984 | Abe et al. | 427/85 |
| 4,677,739 | 7/1987 | Doering et al. | 148/DIG. 82 |
| 4,837,183 | 6/1989 | Polito et al. | 437/198 |
| 4,924,295 | 5/1990 | Kuecher | 357/71 |
| 4,960,732 | 10/1990 | Dixit et al. | 437/192 |
| 4,994,410 | 2/1991 | Sun et al. | 437/192 |
| 5,094,979 | 3/1992 | Kusano | 437/190 |
| 5,106,781 | 4/1992 | DeVries | 437/190 |
| 5,270,254 | 12/1993 | Chen et al. | 437/190 |

FOREIGN PATENT DOCUMENTS

| | | | |
|---|---|---|---|
| 0388563 | 9/1990 | European Pat. Off. | |
| 5319774 | of 0000 | Japan | |
| 57-50429 | 3/1982 | Japan | 437/190 |
| 62-133713 | 6/1987 | Japan | 437/190 |
| 63-275113 | 11/1988 | Japan | 437/195 |

OTHER PUBLICATIONS

M. Inoue et al., "The Properties of Aluminum thin Films Sputter Deposited at Elevated Temperatures", *J. Vac Sa. Tech.-A*, vol. 6, No. 3, May/Jun. 1989, pp. 1636–1639.

*Primary Examiner*—William Powell
*Attorney, Agent, or Firm*—Rodney M. Anderson; Lisa K. Jorgenson; Richard K. Robinson

[57] ABSTRACT

A method for forming aluminum metallization for contacting a conductive element in an integrated circuit, and an integrated circuit formed according to the same, is disclosed. According to a first disclosed embodiment, a first aluminum alloy layer is formed within the contact, optionally with a barrier layer between it and the underlying electrode. An etch stop layer is formed thereover, of a material which has a low etch rate to an aluminum etchant species. A second, thicker, aluminum alloy layer is formed thereover. The second aluminum layer is etched until the etch stop layer is reached; the mask for defining the metal line may have an edge within the dimensions of the contact opening. After removal of the exposed etch stop layer, a timed etch removes the first aluminum alloy layer, without exposing the bottom of the contact. The metal line may thus be safely formed, without requiring an enclosure around the contact opening. According to an alternate embodiment, conductive or semiconductive sidewall spacers may be formed, upon which the metal etch can stop, leaving a metal line within the contact dimensions. A further alternative embodiment uses a conductive etch stop layer which covers the entire contact, and upon which the metal etch can stop within the contact opening.

8 Claims, 8 Drawing Sheets

INTEGRATED CIRCUIT METALLIZATION WITH ZERO CONTACT ENCLOSURE REQUIREMENTS

This is a division of application Ser. No. 07/676,084, filed Mar. 27, 1991, now U.S. Pat. No. 5,270,254.

This invention is in the field of integrated circuits, and is more specifically directed to metallization and interconnection systems therein.

BACKGROUND OF THE INVENTION

In modern integrated circuits, the material of choice for upper-level conductive interconnection systems has been aluminum, including doped aluminum and aluminum alloys. Aluminum is an attractive material for integrated circuit metallization due to its high conductivity and low cost. The processing required to form aluminum metallization is also relatively easy, as it can readily be evaporated or sputtered onto the wafer. Aluminum also is able to form good ohmic contact to both p-type and n-type doped semiconductor material, such as silicon. In addition, aluminum is quite compatible with conventional semiconductor processes, such as used to form bipolar and metal-oxide-semiconductor (MOS) devices, unlike other metals such as copper or gold which can diffuse into active regions and degrade device performance.

Certain drawbacks do exist for aluminum-based metallization systems, however, particularly as geometries enter the sub-micron regime. A well-known limitation of aluminum is its poor step coverage, particularly for vertical or retrograde sidewalls of contact openings through insulating layers such as silicon dioxide, and especially for sputtered aluminum, due to the shadowing effect of steep contact walls. In addition, mechanical stress in the aluminum film can cause voids therein. Stress-induced voids and step coverage faults of sufficient size can each cause an open in a metal line or contact. Furthermore, since aluminum metallization is subject to electromigration, and since the rate of electromigration increases with current density through the film, necking or narrowing of an aluminum line due to such voids or poor steps locally increase the current density thereat. As a result, the electromigration rate increases at a narrowed location of the film, greatly increasing the electromigration failure rate.

A prior technique for addressing these limitations of aluminum metallization systems includes the use of refractory metal plugs, such as tungsten plugs, to fill contact openings in insulating layers. According to one example of this technique (for which many specific methods are well known in the art), after the opening of contacts through the insulating layer, a layer of tungsten is deposited by CVD over the wafer in such a manner as to conformally fill the contact opening, and is subsequently etched back to expose the surface of the insulating layer with the tungsten remaining in the contact opening. Alternatively, selective tungsten deposition has been used (the tungsten depositing on silicon but not on silicon dioxide) to fill contact openings. In either case, a subsequently deposited aluminum layer can readily make contact to the tungsten plug.

While the tungsten plug technique has many advantages, including good step coverage in all contacts, compatibility with planarized processing, and tolerance of misalignment in the etch of overlying aluminum lines (since the aluminum can be etched selectively relative to the tungsten), the tungsten plug process adds complexity to the manufacturing flow. In addition, deposited tungsten is vulnerable to poor adhesion and high contact resistance, requiring the use of additional sputtered barrier films prior to the deposited tungsten, and the associated added process complexity therewith.

Our copending U.S. patent application Ser. No. 621,367, filed Nov. 30, 1990, now abandoned, assigned to SGS-Thomson Microelectronics, Inc., and incorporated herein by this reference, describes an aluminum plug process which addresses these limitations of both conventional aluminum films and tungsten plug processes. This process is also described in Chen, et al., "Planarized Aluminum Metallization for Sub-0.5 $\mu$m CMOS Technology", *IEDM Digest of Technical Papers*, paper 3.4.1 (IEEE, Dec. 1990), pp. 51–54, also incorporated herein by this reference. According to this process, aluminum is sputtered at low enough rates, with the wafer at an elevated temperature, such that the sputtered aluminum migrates along the surfaces of contact openings to the bottom. Continued sputtering, either at the same or an increased rate, completely fills the contact opening, in effect forming an aluminum plug therein.

This process has provided dramatic results in forming sub-micron metallization with complete step coverage. In patterning and etching the overlying metallization lines, however, great care is preferably taken so that the edge of the overlying line does not lie within the contact opening. If the edge of the metal line overlies the contact, the metal line and plug may both be etched by the metal etch process all the way to the underlying layer, causing junction leakage and other degradation thereat. As a result, prior to the subject invention, the preferred layout of the metal lines included its widening at contact locations by a sufficient distance (referred to as the "enclosure") to compensate for the worst case misalignment. While this widening of the metal lines at the contact locations eliminates the problem of etching through the plug into the underlying contacted layer, the layout of the integrated circuit must include sufficient space for the enclosure. Particularly in regularly laid-out circuits such as memories, significant added chip size may result.

By way of further background, it is known to use insulating sidewall filaments to narrow contact openings, such that metal lines making contact therethrough need not be widened to provide misalignment tolerance. Such a technique is described in U.S. Pat. No. 4,656,732. However, as described in this reference, the insulating sidewalls also increase the series resistance of the contact, as the cross-sectional area of the ohmic contact is reduced (see column 5, line 64 through column 6, line 26) of the above-referenced U.S. Pat. No. 4,656,732. Such increase in the series resistance is of increasing concern as the contact openings become smaller, especially to sub-micron dimensions.

It is therefore an object of this invention to provide a method of forming an integrated circuit metallization system which eliminates the need for enclosure around contact locations.

It is a further object of this invention to provide such a method which allows the filling of contact openings with the same metallization as that of the metal lines.

It is a further object of this invention to provide such a method which fills contact openings with aluminum.

It is a further object of this invention to provide such a method which does not reduce the contact area and thus increase the contact resistance.

Other objects and advantages of this invention will be apparent to those of ordinary skill in the art having reference to the following specification, together with its drawings.

SUMMARY OF THE INVENTION

The invention may be incorporated into a method for forming an integrated circuit, and the integrated circuit formed thereby, by the provision of a thin etch stop layer within the metallization system, and extending over the contact opening. Etching of the metallization may be performed until the etch stop is reached. According to a first embodiment of the invention, the etch stop layer is within the metallization layer, and extends over the surface of the wafer; upon reaching the etch stop, a short timed etch of the remaining metallization will clear the metal outside of the masked locations. According to alternate embodiments of the invention, conductive spacers are provided in the contact opening and the etch stop layer overlies the spacer. Etching of the metallization can be done to clear, with the spacers providing misalignment tolerance. In either case, aluminum may be used not only as the overlying metallization, but also in the contact openings.

BRIEF DESCRIPTION OF THE DRAWINGS

FIG. 2 is a plan view of a metal line over a contact opening according to the prior art, addressing the problem illustrated in FIG. 1a.

DETAILED DESCRIPTION OF THE PREFERRED EMBODIMENTS

Figure 1:
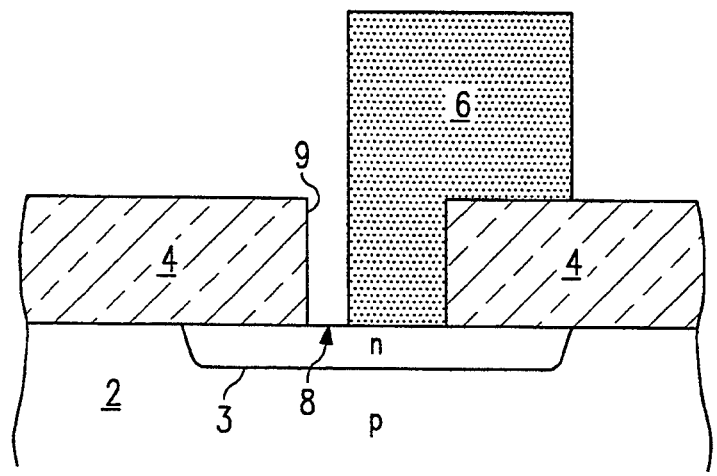
FIG. 1 is a cross-sectional view of a failed contact according to the prior art.

Referring first to FIG. 1, a portion of an integrated circuit formed according to the prior art is shown in cross-section, for purposes of illustrating a problem addressed by the present invention. In the structure of FIG. 1, contact is to be made to an n-type region 3 which is at the surface of a p-type substrate 2, through an opening 9 in an insulating layer 4, disposed at the surface of substrate 2. As will be apparent to those in the art, such contact is also often made to p-type regions doped into the surface of n-type regions, to overlying layers of polysilicon and metal, and to other well-known structures in the art; it is therefore contemplated that the contacts described herein, both relative to the prior art and also to the preferred embodiments of the invention, are applicable to all such contacts.

Metal 6 in the prior art structure of FIG. 1 is conventionally aluminum, which may be doped with, or is an alloy of, copper or silicon. Metal 6 is thus generally sputtered onto the wafer containing the structure of FIG. 1, after the contact openings 9 have been formed through insulating layer 4. The aluminum sputtering may be performed according to conventional processes, or also according to the method described in our co-pending U.S. patent application Ser. No. 621,367, filed Nov. 30, 1990, assigned to SGS-Thomson Microelectronics, Inc., and in Chen, et al., "Planarized Aluminum Metallization for Sub-0.5 $\mu$m CMOS Technology", *IEDM Digest of Technical Papers,* paper 3.4.1 (IEEE, Dec. 1990), pp. 51–54, both incorporated herein by this reference. Photolithographic patterning is then performed to define the locations at which metal 6 is to remain, including over contacts 9, and metal 6 is then etched except where protected by the masking material.

In the example shown in FIG. 1, the photolithographic patterning of metal 6 is misaligned relative to the formation of contact opening 9. Such misalignment is not an unexpected occurrence in the manufacture of integrated circuits, particularly those having extremely small, sub-micron, geometries. FIG. 1 illustrates, however, that if the misalignment is sufficiently severe that the edge of the desired metal line 6 is within the boundaries of contact opening 9, the etching of the metal (as aluminum is etched at very high rates by conventional etchants) will cause the entire thickness of metal line 6 to be removed both above and within contact opening 9, exposing location 8 of n-type region 3 at the bottom of contact opening 9. While many aluminum etchants etch aluminum selectively relative to silicon, the etching illustrated in FIG. 1 can cause silicon pitting if the selectivity is not high enough. Excessive pitting can cause junction leakage between n-type region 3 and p-type substrate 2, and other deleterious effects as are well known in the art as a result of such misalignment.

Figure 2:
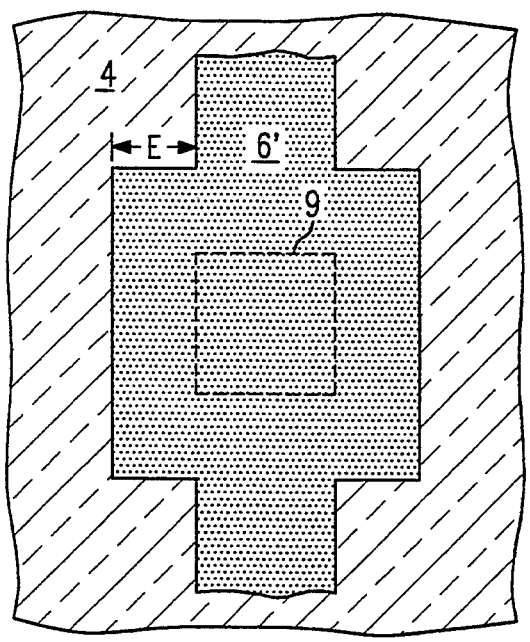

Referring now to FIG. 2, a portion of an integrated circuit according to the prior art is illustrated in plan view, showing a well-known technique of reducing the sensitivity of the circuit to the misalignment of FIG. 1. The solution addressed in FIG. 2 is to layout the metallization pattern 6' in such a way that each metal line is wider in locations of contact openings 9. The extent to which metallization 6' is widened at contact location 9 is often referred to as the enclosure, shown as E in FIG. 2. Enclosure E is not only provided for the width of metallization 6', but is also provided lengthwise, so that misalignment at an angle will not cause a portion of contact opening 9 to be exposed at one of its corners.

For modern integrated circuits, where the desired width of metallization 6' is on the order of 1$\mu$, enclosure E may be on the order of 0.25$\mu$ on a side, in order to ensure that the expected misalignment tolerance of the photolithographic equipment will not cause undue yield loss due to the mechanism shown in FIG. 1. However, provision of such enclosure necessarily consumes silicon surface area; for ultra large-scale integrated circuits having millions of contacts, the additional chip area required for such enclosure can be significant, especially in circuits such as memories where contacts are repetitive and located in the most critical region (for purposes of chip area definition). Accordingly, such enclosure E can be costly in manufacturing cost.

It should be noted that another prior method of minimizing the problem of FIG. 1 is to use a timed etch for metal 6, rather than a full etch-to-clear. However, since metal 6 can be quite thick, for example on the order of 1 $\mu$m, it is difficult to properly time an etch so that bridging or shorts are all removed, while still keeping the etch time below that required to reach doped region 3 if misaligned as shown in FIG. 1. In addition, considering variation in sputtered thickness of metallization 6 over the surface of a large wafer, and further considering the difficulty in clearing filaments of metal at steps, it is entirely likely that a timed etch of a thick metal layer 6 may result in both metal shorts on one area of the wafer, and junction leakage due to overetch on another area of the wafer.

Figure 3A:
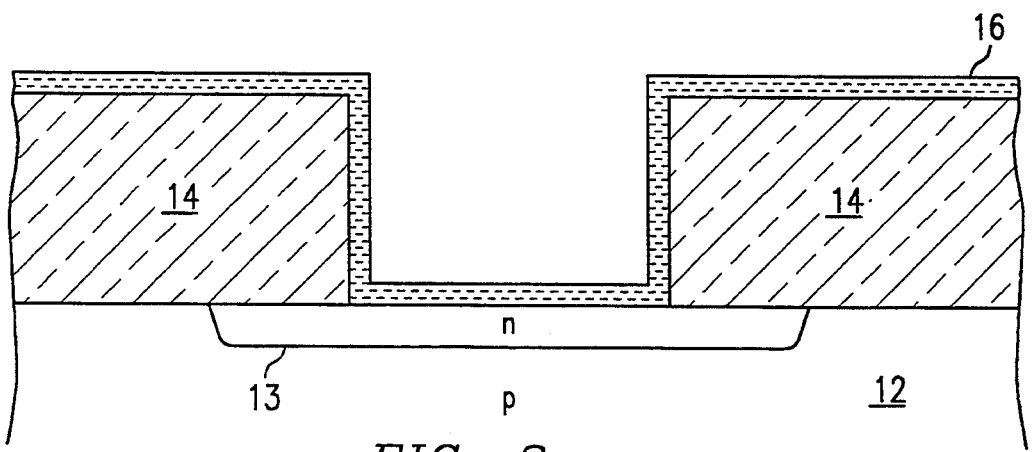
FIGS. 3a through 3h are cross-sectional views of the fabrication of an integrated circuit, at various steps, according to a first embodiment of the invention.

Referring now to FIGS. 3a through 3h, a first embodiment of the invention will now be described which allows for the use of aluminum metallization for making contacts, but in such a manner that enclosure distance E may be zero (or, indeed, negative). FIG. 3a illustrates, in cross-section, a partially formed integrated circuit structure at a surface of a wafer. N-type doped region 13 is located at a surface of p-type substrate 12, and is the structure to which connection is to be made in this example of the invention. As noted hereinabove, while a contact to an n-type diffusion is illustrated, the invention is equivalently applicable to contacts to a p-type diffusion, polysilicon electrodes, metal lines, and other structures in conventional integrated circuits. Furthermore, it should be noted that the present invention is also compatible with planarized processes, where contacts of different depths must be simultaneously made from the same planar surface (e.g., contacts to diffusion and polysilicon both made from the same planarized surface of silicon dioxide).

In FIG. 3a, insulating layer 14 is shown after a contact opening has been formed therein. In accordance with state-of-the-art technology, the width of the contact opening may be on the order of 1.0 $\mu$m or smaller. Insulating layer 14 may be any conventional insulator useful in modern integrated circuits, and is generally silicon dioxide, either as a single layer or as multiple layers. Depending on the particular process, insulating layer 14 may optionally be annealed to such a temperature that it reflows after the contact openings are formed, to improve metal step coverage. The thickness of insulating layer 14 through which the contact opening is formed can be on the order of 1.0 $\mu$m. Also illustrated in FIG. 3a is barrier layer 16. Barrier layer 16 is optional for purposes of this invention, but is preferred, particularly if the junctions are very shallow (on the order of 0.25 $\mu$m or less), to prevent the diffusion, or spiking, of aluminum atoms through n-type region 13 into substrate 12 which can short out the p-n junction. According to this embodiment of the invention, barrier layer 16 consists of a 60 nm layer of titanium covered by a 100 nm layer of titanium nitride, deposited sequentially by CVD, or by physical vapor deposition (PVD), a type of which is sputtering. However, other barrier materials, or no barrier layer 16, may alternatively be used. Further in the alternative, barrier layer 16 may be formed to underlie insulating layer 14, or in such a manner (such as by direct reaction of a refractory metal with silicon), so as to be localized at the bottom of the contact opening.

Figure 3B:
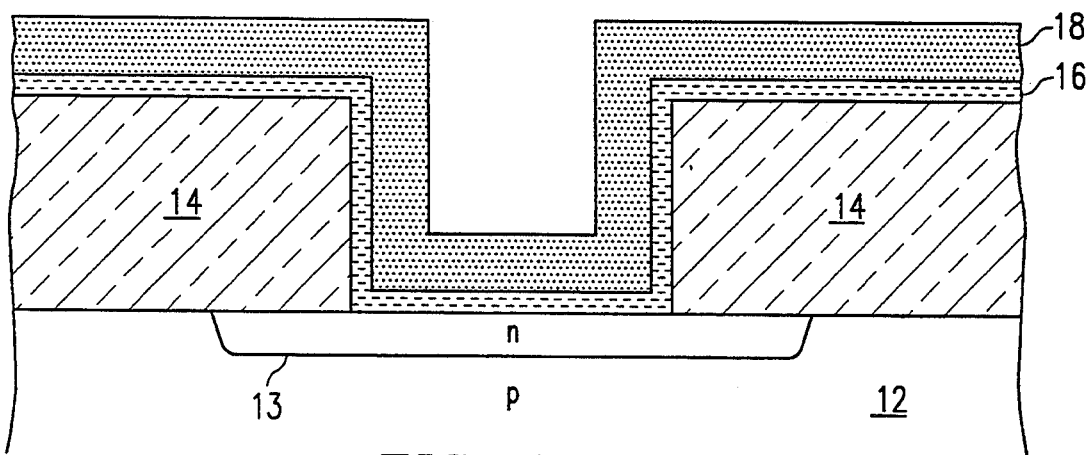

After deposition of barrier layer 16 (if desired), first aluminum layer 18 is sputtered over the surface of the wafer, to a thickness on the order of 100 nm to 200 nm, in this example. First aluminum layer 18 preferably is doped with silicon, copper, or both, or other conventional dopant material, as is well known in the art. In this example, the preferred aluminum alloy for first aluminum layer 18 is Al-1%Si-0.5%Cu. For best uniformity and conformality, with reduced shadowing, the method described in our copending U.S. patent application Ser. No. 621,367, filed Nov. 30, 1990, assigned to SGS-Thomson Microelectronics, Inc., and in Chen, et al., "Planarized Aluminum Metallization for Sub-0.5 $\mu$m CMOS Technology", *IEDM Digest of Technical Papers*, paper 3.4.1 (IEEE, Dec. 1990), pp. 51–54, both incorporated herein by reference, is preferred for the sputtering of aluminum layer 18. As described therein, sputtering of aluminum at an elevated temperature, for example between 350° C. and 500° C., at relatively slow rates, allows for surface migration of the sputtered aluminum atoms toward the bottom of the contact opening. By adjusting the sputtering rate and the temperature, different variations in the profile of the sputtered aluminum can result, including relatively conformal coverage in the contact opening through insulating film 14 as shown in FIG. 3b. Other known techniques for sputtering or otherwise depositing aluminum film 18 in a conformal manner may alternatively be used; the success of such other techniques will strongly depend upon the sizes of the geometries of the structure.

Figure 3C:
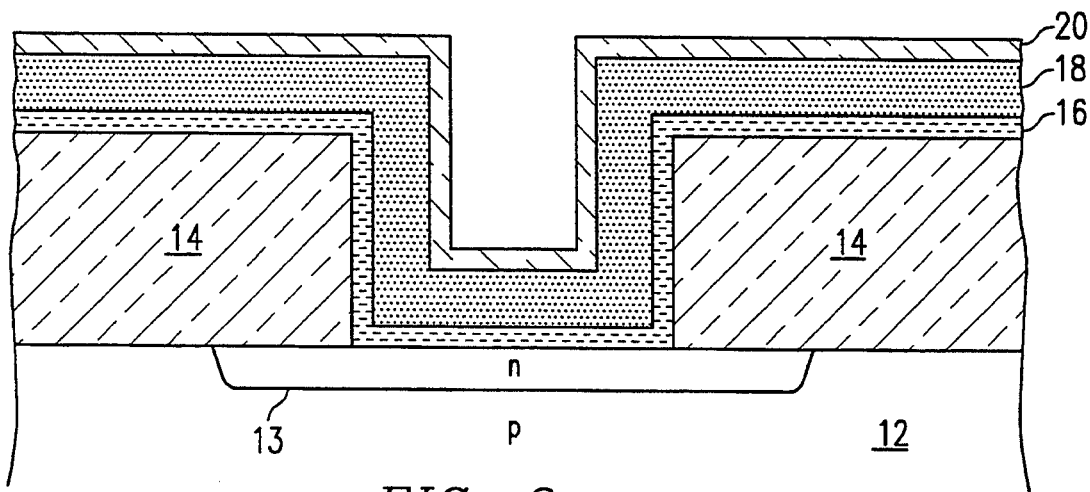

Referring now to FIG. 3c, after the sputtering of first aluminum layer 18, etch stop layer 20 is deposited thereover. A preferred material for etch stop layer 20 is sputtered tungsten; it should be noted, however, that any conductive material relative to which aluminum and aluminum alloys may be selectively etched is appropriate for use as etch stop layer 20. According to this example of the invention, the preferred thickness for etch stop layer 20, formed of sputtered tungsten, is on the order of 80 nm.

Figure 3D:
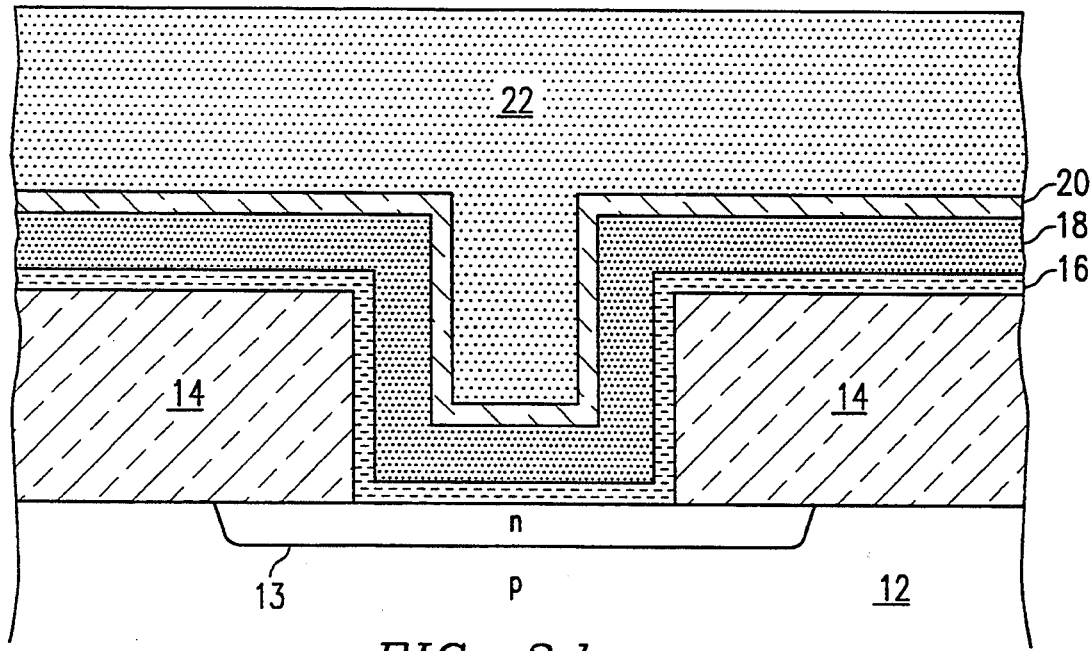

A second aluminum film 22 is then sputtered thereover, resulting in the structure as shown in FIG. 3d. Since aluminum film 22 will be the primary conduction path for current in the resulting integrated circuit, it will generally be quite thick, for example on the order of 500 to 800 nm in this example. In addition, aluminum film 22 will also preferably be doped with silicon, copper, or other known materials; copper is particularly beneficial, due to its well known properties of reducing electromigration rates. In this example, the preferred aluminum alloy for second aluminum layer 22 is also Al-1%Si-0.5%Cu. FIGS. 3c and 3d show that a gap exists within the contact opening, above etch stop 20, which is to be filled with second aluminum film 22. It is therefore strongly preferred that aluminum film 22 be sputtered according to the method described in our copending U.S. patent application Ser. No. 621,367, filed Nov. 30, 1990, assigned to SGS-Thomson Microelectronics, Inc., and in Chen, et al., "Planarized Aluminum Metallization for Sub-0.5 $\mu$m CMOS Technology", *IEDM Digest of Technical Papers*, paper 3.4.1 (IEEE, Dec. 1990), pp. 51–54, both incorporated herein by reference.

It should also be noted that it is preferred that the sputtering or other deposition of barrier layer 16, etch stop 20, and aluminum layers 18 and 22, be performed in a multi-chamber processing machine, such as the model M2000 manufactured and sold by Varian. As is well known, such multi-chamber machines allow for the sequential deposition of layers of different composition without requiring removal of the wafer from the deposition chamber (and the possibility that native oxides form on the surface of the metal layers, requiring deglazes to be performed immediately prior to the next deposition in order that good electrical continuity is maintained, layer-to-layer). By use of such multi-chamber machines, an otherwise cumbersome process (such as the deposition of several successive layers of different composition) can be made relatively easy.

Figure 3E:
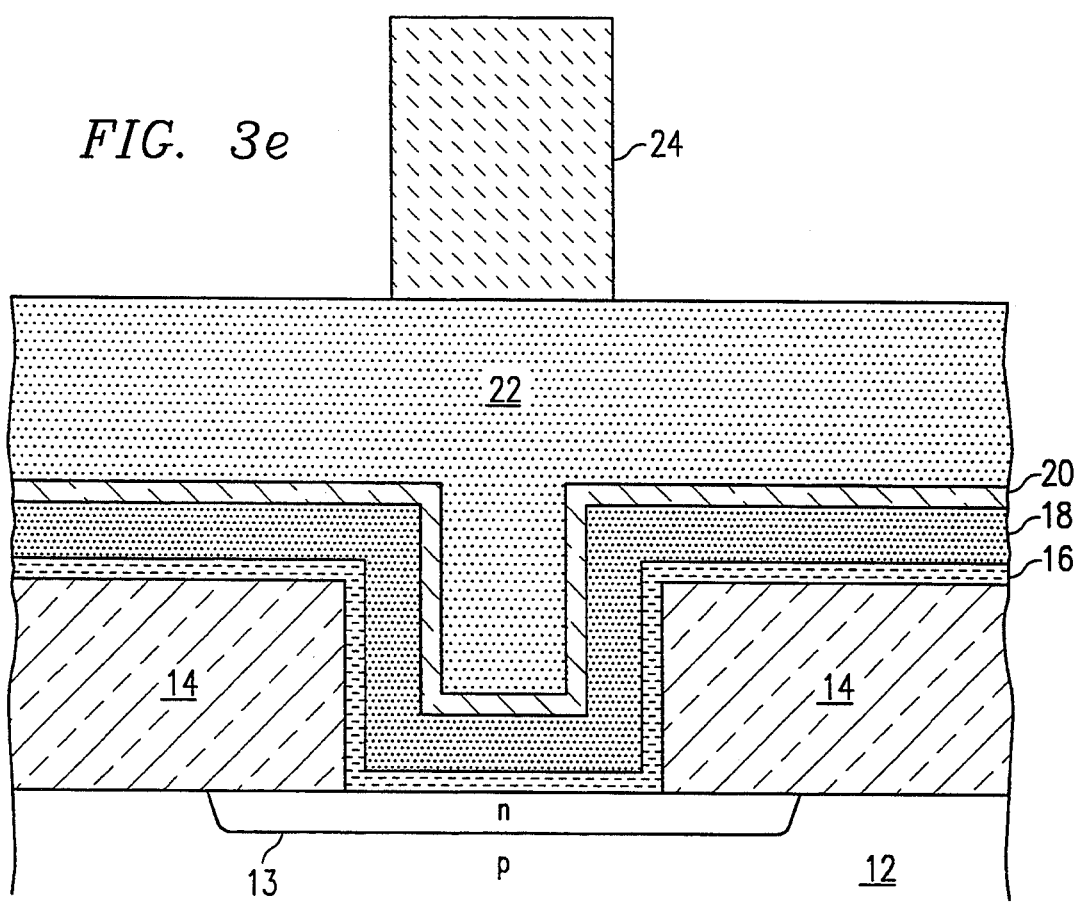

Referring now to FIG. 3e, mask layer 24 is formed over the portion of aluminum layer 22 at which the eventual metal line is to be formed. Mask layer 24 may be conventional photoresist, exposed and developed in the conventional manner, or may be a hard mask such as silicon dioxide. It is contemplated that any of the numerous conventional methods for defining a pattern for metal etch will be appropriate for the formation of masking layer 24 according to this embodiment of the invention. It is contemplated that the width of mask layer 24 may be on the order of 1.0 μm or less, using state-of-the-art lithography and etch technology. It should also be noted that the width of mask layer 24 according to this example may be the same as or narrower than the width of the contact opening in insulating film 14; as will be discussed in further detail hereinbelow relative to FIG. 4, the eventual metal line requires zero enclosure spacing relative to the width of the contact opening.

Figure 3F:
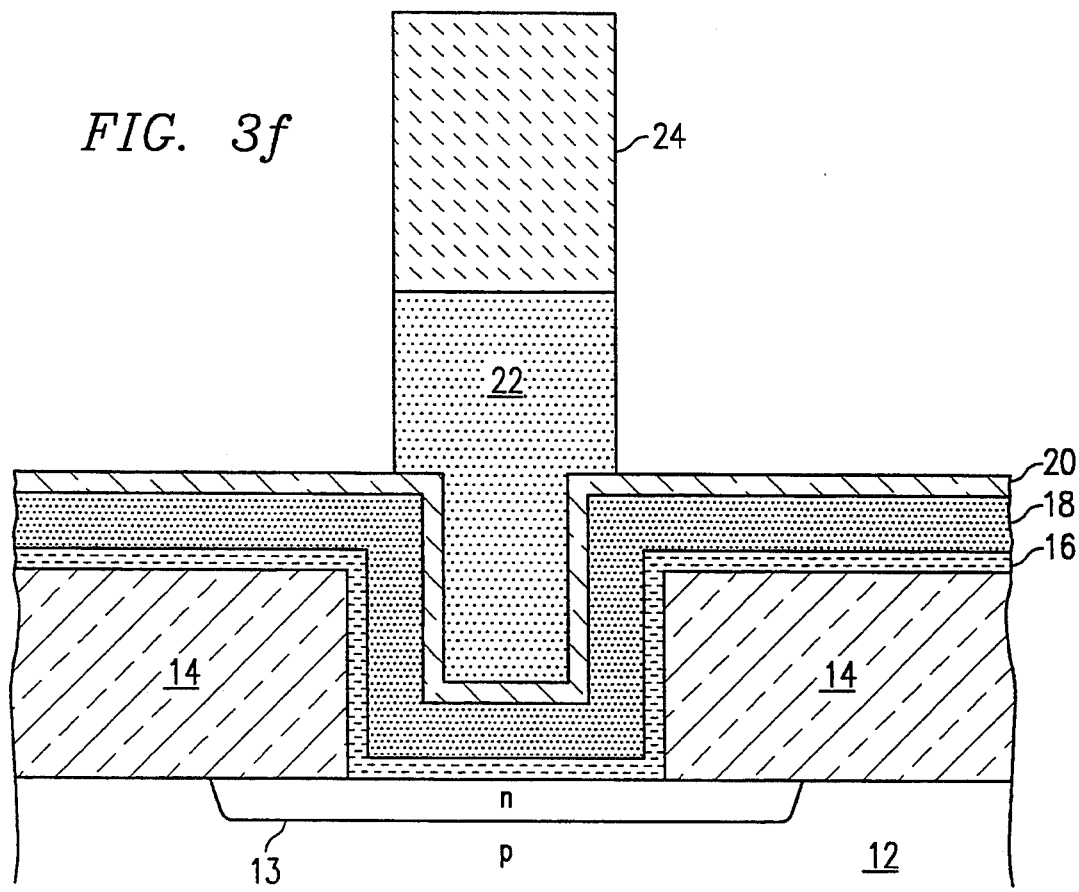

After the definition of mask layer 24, the wafer is exposed to an etchant which selectively etches aluminum layer 22 relative to etch stop 20. A conventional chlorine-based plasma etch, as commonly used in etching aluminum films, is the preferred etch according to this example where etch stop 20 is tungsten as described hereinabove. Particularly for sub-micron geometries, it is preferred that the etch be as anisotropic as possible; however, as is well known in the art, it may be necessary to oversize the width of mask layer 24 to allow for some undercut of the mask. As shown in FIG. 3f, this etch of aluminum layer 22 will stop on etch stop 20, due to the inability of the etchant species to react with etch stop 20.

Figure 3G:
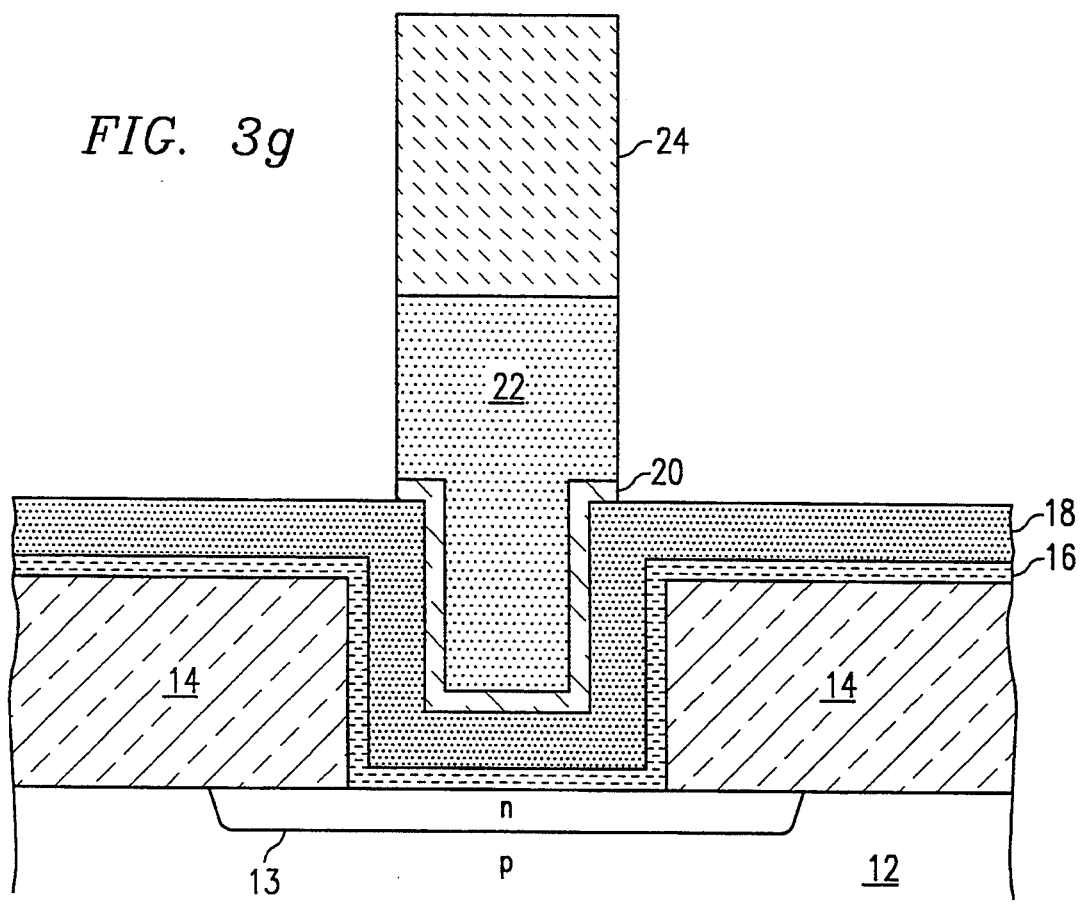
Figure 3H:
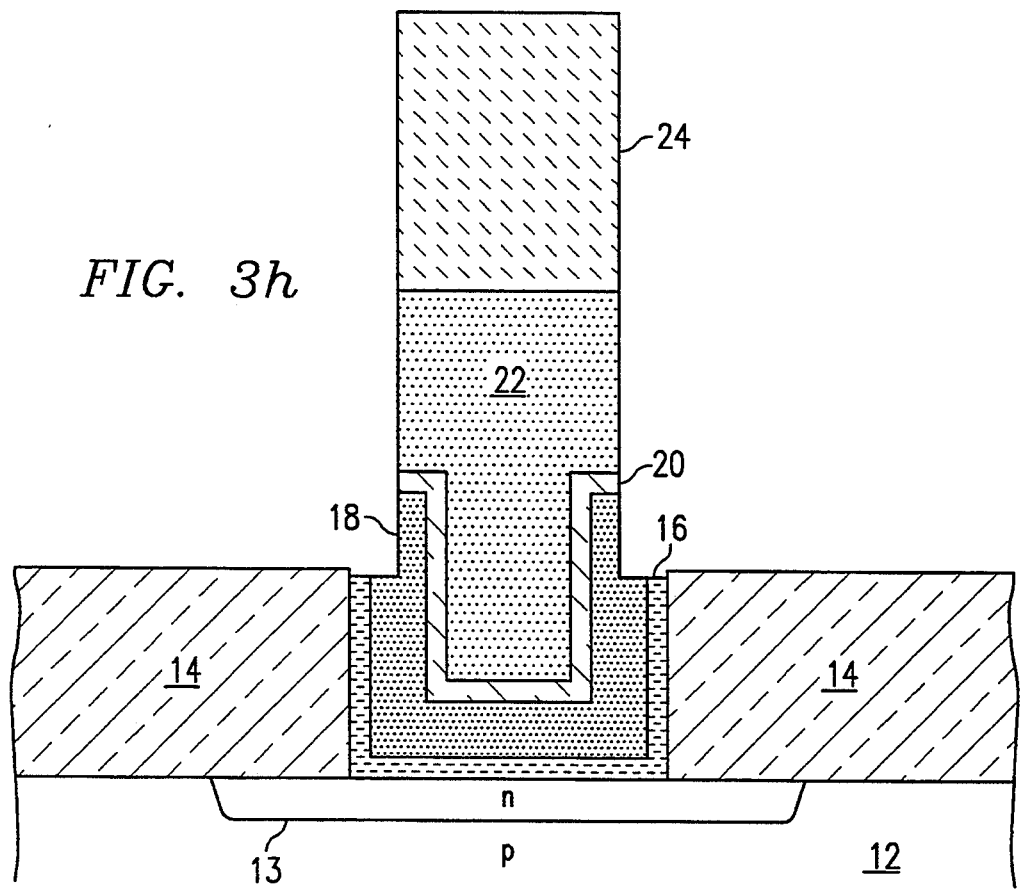

Etch stop 20 is next etched, using an etch which selectively etches its material relative to aluminum. As such, aluminum layer 22 serves as a mask to the etching of etch stop 20, and the etch of etch stop 20 may be done to clear, as it will stop on first aluminum layer 18. For this example, where etch stop 20 is tungsten, a conventional plasma etch for tungsten using a fluorine-based chemistry such as, for example, an etch with $CF_3^+$ as the active species, is preferred. The results of this etch are illustrated in FIG. 3g.

Following the etching of etch stop 20, completion of the etching of the metal system of this embodiment of the invention is performed. This final etch of first aluminum layer 18 and barrier layer 16 (if present) is a timed plasma etch, using a chlorine-based plasma under similar conditions as in the etch of aluminum layer 22. This etch will clear both aluminum layer 18 and barrier layer 16 (of titanium-nitride and titanium) where exposed. It is highly preferred that the etch be as anisotropic as possible, so that aluminum layer 22 is not undercut beneath mask layer 24 (or aluminum layer 18 undercut under etch stop 20.

Of course, the timing of the etch should be selected so that etching of aluminum layer 18 and barrier layer 16 stops before reaching the bottom of the contact opening. This etching should be timed so that the top surfaces of aluminum layer 18 and barrier layer 16 are slightly below the surface of insulating layer 14 at locations inside the contact opening but outside of the line defined by aluminum layer 22. However, etching of these layers to a level below the surface of insulating layer 14 will not degrade device performance or reliability. For the above example of the invention, where the thickness of aluminum layer 18 is on the order of 200 nm, and where barrier layer 16 consists of a 60 nm layer of titanium covered by a 100 nm layer of titanium nitride, the preferred example of such a timed etch is a plasma etch using a chlorine-based chemistry (for example, containing $BCl_3$ or $Cl_2$ as the active species) for a time on the order of one to three minutes, preferably two minutes.

It should be noted, however, that the timing of the etch of aluminum layer 18 and barrier layer 16 may be much more easily controlled than prior techniques where the entire metal system was aluminum, and may be controlled well within the ability of conventional manufacturing lines. This is due to the presence of etch stop 20, which allows the bulk of the metal etching (i.e., of aluminum layer 22) to be performed in an etch-to-clear fashion, without concern from overetch. The timed etch of aluminum layer 18 is quite short, as noted above, as aluminum layer 18 and barrier layer 16 together are quite thin. Accordingly, the process margin, as a percent of the etch time, will be much larger for the short timed etch of aluminum layer 18 than it would be for the much longer etch time required to etch a conventional aluminum metal line.

In addition, the thickness of insulating layer 14 provides significant margin for overetch of aluminum layer 18 and barrier layer 16. In this example, the total thickness of aluminum layer 18 and barrier layer 16 is 360 nm, while the thickness of insulating layer 14 is on the order of 1000 nm. Due to this ratio, the etch time required to clear aluminum layer 18 and barrier layer 16 from the surface of insulating layer 14 may be exceeded by over 250% before the bottom of the contact opening is reached.

Figure 4:
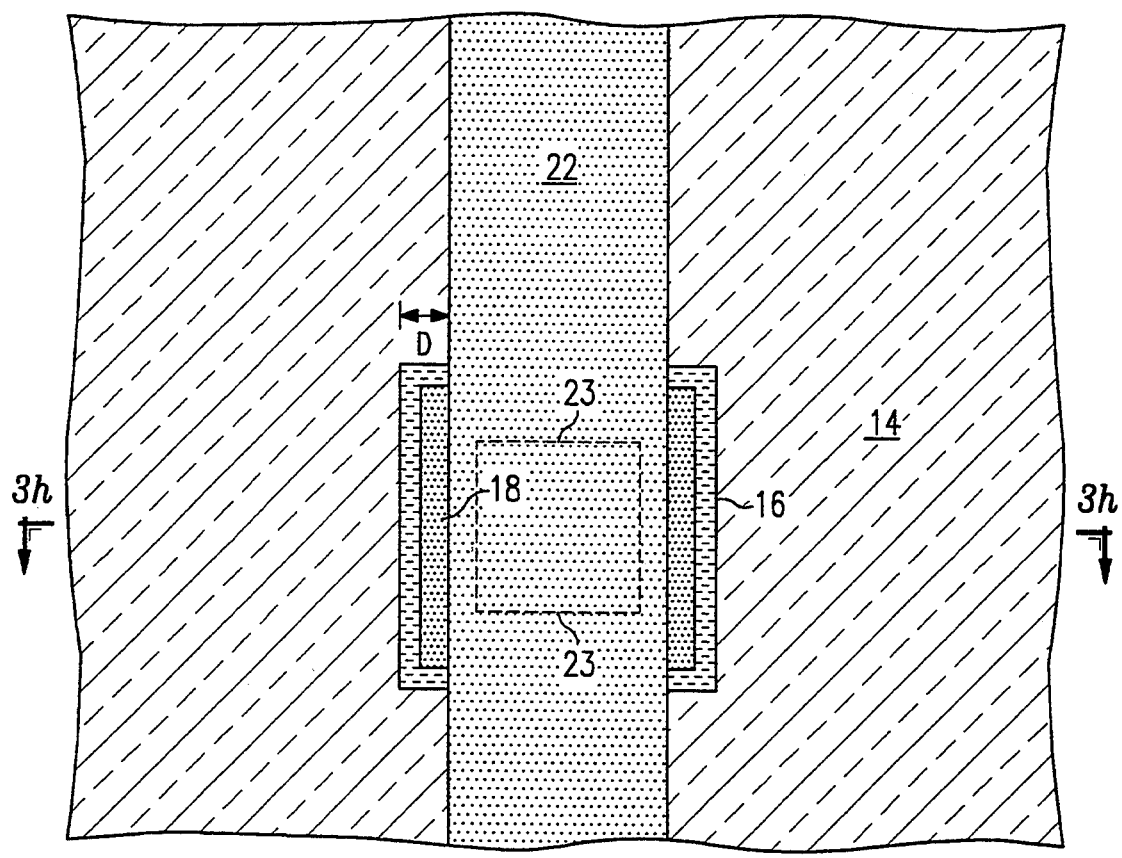
FIG. 4 is a plan view of a portion of an integrated circuit according to the first embodiment of the invention.

Referring now to FIG. 4, the metal line formed according to the embodiment of the invention described hereinabove, after removal of mask layer 24, is illustrated in plan view. As is especially apparent from FIG. 4, no enclosure space outside of the boundary of contact opening 23 is required. Indeed, in the example described hereinabove, the width of metal line may be inside of the contact opening, for example by a distance D. As a result, less chip area is required for an integrated circuit formed according to the present invention than for the same circuit formed according to the prior art, where enclosure width E was required around each contact.

It should further be noted that misalignment tolerance is also provided by the present invention. Referring back to FIG. 3h, it should be noted that the edges of mask layer 24 are within the contact opening, over the vertical portions of aluminum layer 18 therewithin. It should be noted that misalignment of mask layer 24 such that an edge overlies the vertical portion of barrier layer 16, or even overlies insulating layer 14 (with the other edge overlying the vertical portion of etch stop 20 in the contact opening) will not cause a failed contact, as would occur according to prior methods. It should be noted, however, that misalignment of such severity that an edge of mask layer 24 overlies the portion of aluminum layer 22 between the vertical portions of etch stop 20 within the contact opening is not desirable. Of course, widening of mask layer 24 on both sides to overlie barrier layer 16, or insulating layer 14, can be used with the present invention; as the width of the mask layer 24 (and the eventual metal line) overlaps onto insulating layer 14 outside of the contact opening, however, the benefits of the invention in allowing for zero enclosure space are of course much reduced.

Figure 5A:
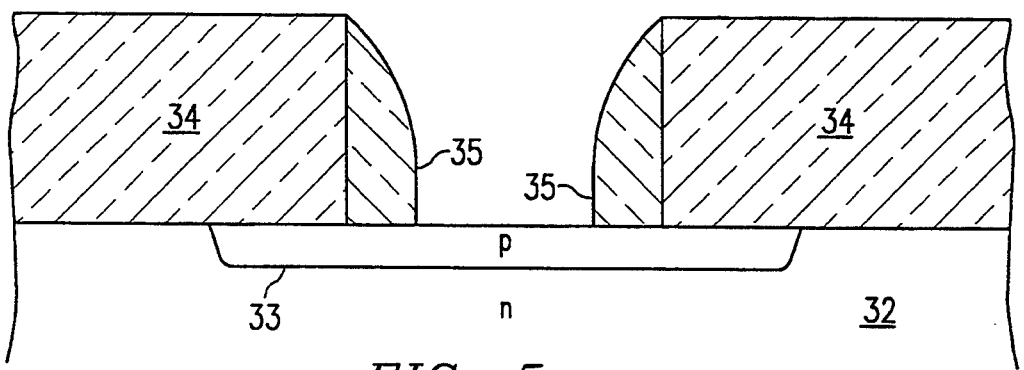
FIGS. 5a through 5c are cross-sectional views of the fabrication of an integrated circuit, at various steps, according to a second embodiment of the invention.
Figure 5B:
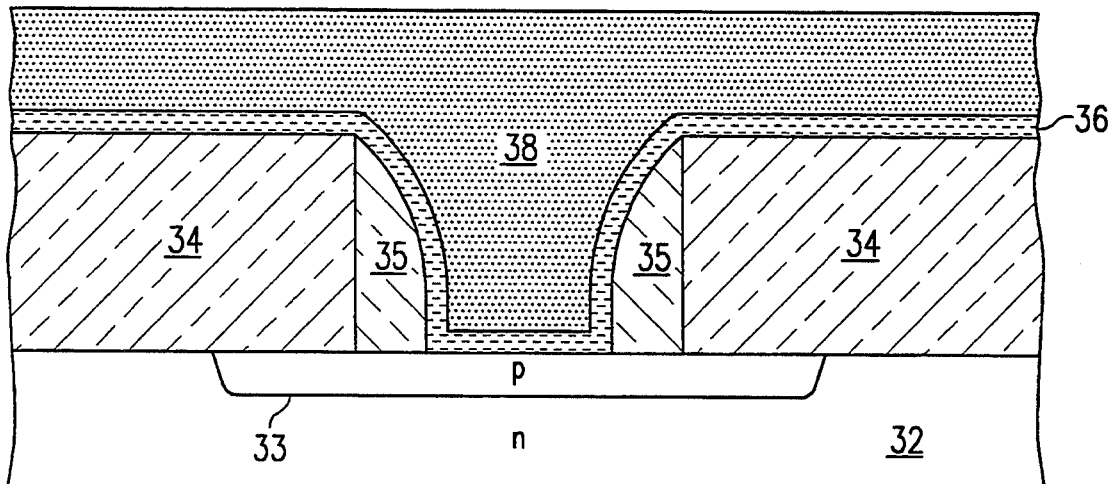
Figure 5C:
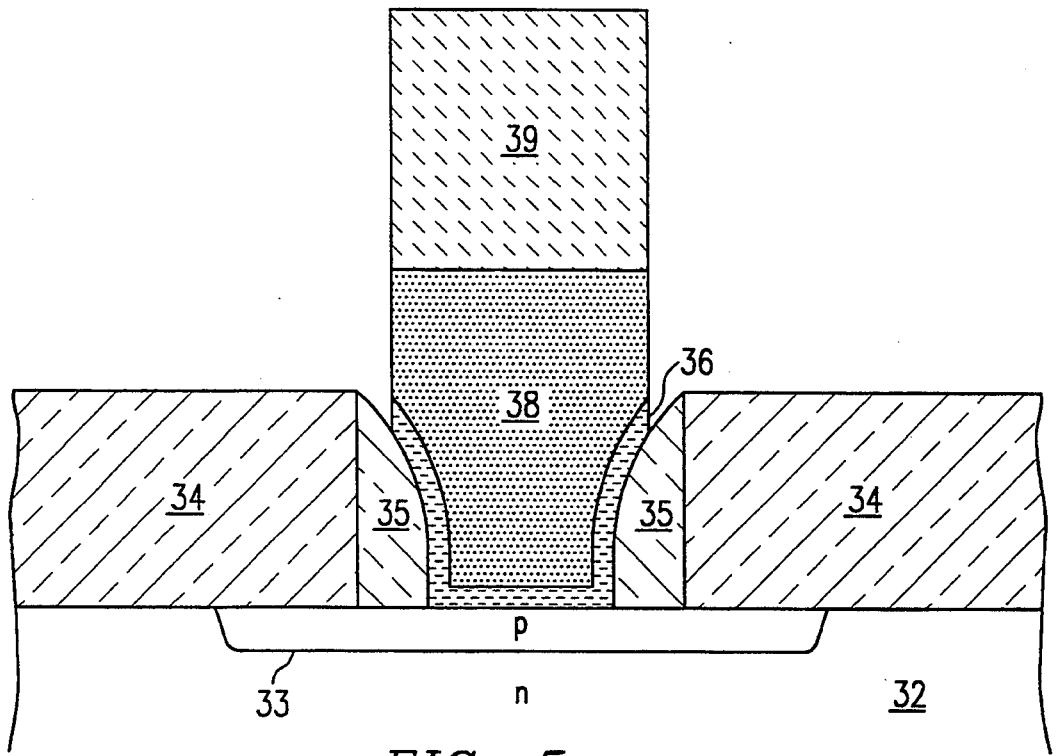

Referring now to FIGS. 5a through 5c, an alternate embodiment of the invention will now be described, relative to cross-sectional views of a portion of an integrated circuit formed thereby. FIG. 5a illustrates a partially formed circuit, similar to FIG. 3a discussed hereinabove, where a contact is to be made through insulating layer 34 to a p-type doped region 33 at the surface of an n-type body 32; also as described hereinabove, this embodiment of the invention is equivalently applicable to contacts to n-type semiconductor material, as well as to overlying electrodes of metal or semiconducting material such as polysilicon. As in the example of FIG. 3a, insulating layer 34 is any conventional insulating layer known to those of ordinary skill in the art, and is commonly silicon dioxide in a single or multiple layers.

As shown in FIG. 5a, a first step according to this embodiment of the invention is the formation of sidewall spacers 35 on the sides of the contact opening in insulating layer 14. While sidewall spacers 35 are shown in the cross-sectional view of FIG. 5a as being on two sides of the opening, they will of course also be present on all other sides of the opening through insulating layer 14. As is conventional for the formation of sidewall spacers for graded junction transistors, sidewall spacers 35 are preferably formed by the deposition of a conformal layer over the surface of the wafer, followed by an anisotropic etch to remove the layer from the flat surfaces of the wafer to leave filaments of the material on the sidewalls of steps, such as within the contact opening of FIG. 5a. This is because the vertical portions of the conformal layer are thicker than are the portions on flat surfaces, such as on the surface of insulating layer 14 outside, and at the bottom of, the contact opening.

According to this embodiment of the invention, sidewall spacers 35 are formed of a conducting or semiconducting material, such as a refractory metal, doped polysilicon, or the like. As will be apparent from the description hereinbelow, it is important that the material of sidewall spacers 35 be selected so that aluminum films may be selectively etched relative thereto, i.e., so that sidewall spacers 35 may serve as an etch stop to the metal etch.

After formation of sidewall spacers 35, barrier layer 36 and aluminum layer 38 is sputtered or otherwise deposited over the surface of the structure, as shown in FIG. 5b. Barrier layer 36, as described hereinabove, is preferred in order to prevent junction spiking, and as such may consist of conventional materials known in the art for so doing; the preferred composition of barrier layer 36 is, as in the case described hereinabove, a layer of titanium covered by a layer of titanium nitride. Aluminum layer 38, also as described hereinabove, is for conducting the bulk of the current flow through the eventual metal line; as such, it is preferably that aluminum layer 38 consist of an alloy, for example, Al-1%Si-0.5%Cu.

It should also be noted that aluminum layer 38 must fill the remaining portion of the contact opening. As noted hereinabove, the method described in our co-pending U.S. patent application Ser. No. 621,367, filed Nov. 30, 1990, assigned to SGS-Thomson Microelectronics, Inc., and in Chen, et al., "Planarized Aluminum Metallization for Sub-0.5 $\mu$m CMOS Technology", *IEDM Digest of Technical Papers*, paper 3.4.1 (IEEE, Dec. 1990), pp. 51-54, both incorporated herein by reference, is the preferred method of forming aluminum layer 38. Also as noted hereinabove, it is also preferred, from a process complexity standpoint, that aluminum layer 38 and barrier layer 36, if used, be sputtered sequentially using multi-chamber processing equipment, to reduce wafer movement and the formation of native oxides.

After the formation of barrier layer 36 and aluminum layer 38, metal etch is performed with the appropriate mask layer 39 defining the locations at which aluminum layer 38 and barrier layer 36 are to remain. According to this embodiment of the invention, aluminum layer 38 (and barrier layer 36) is etched selectively relative to the material of sidewall spacers 35. The ability to selectively etch aluminum layer 38 relative to sidewall spacers 35 allows the edges of mask layer 39 to be located (either actually or oversized to account for undercutting of mask layer 39) at or within the edges of the contact opening. As shown in FIG. 5c, the edges of mask layer 39 are each within the contact opening, located directly over sidewall spacers 35. The etch may be continued with sufficient overetch to ensure that the wafer is fully cleared, without concern that the etchant will expose or etch into doped region 33 (or such other region at the bottom of the contact opening). For sidewall spacers 35 formed of polysilicon, a conventional chlorine-based plasma metal etch is preferred to selectively etch both aluminum layer 38 and barrier layer 36 (formed of titanium-titanium nitride) relative to sidewall spacers 35.

As is evident from FIG. 5c, the resulting metal line 38 can be formed according to this embodiment of the invention with zero enclosure spacing outside of the contact opening or even, as shown in FIG. 5c, so as to be within the contact opening. It should be noted, however, that definition of mask layer 39 with exactly zero enclosure is preferred, as no additional chip area is required for zero enclosure versus a negative enclosure (as contact opening must be defined anyway), and as zero enclosure provides additional misalignment tolerance. In addition, since sidewall spacers 35 are conducting, or at least semi-conducting, the cross-sectional contact area is not reduced by sidewall spacers 35. As a result, the series contact resistance is not significantly increased in this embodiment of the invention.

Figure 6A:
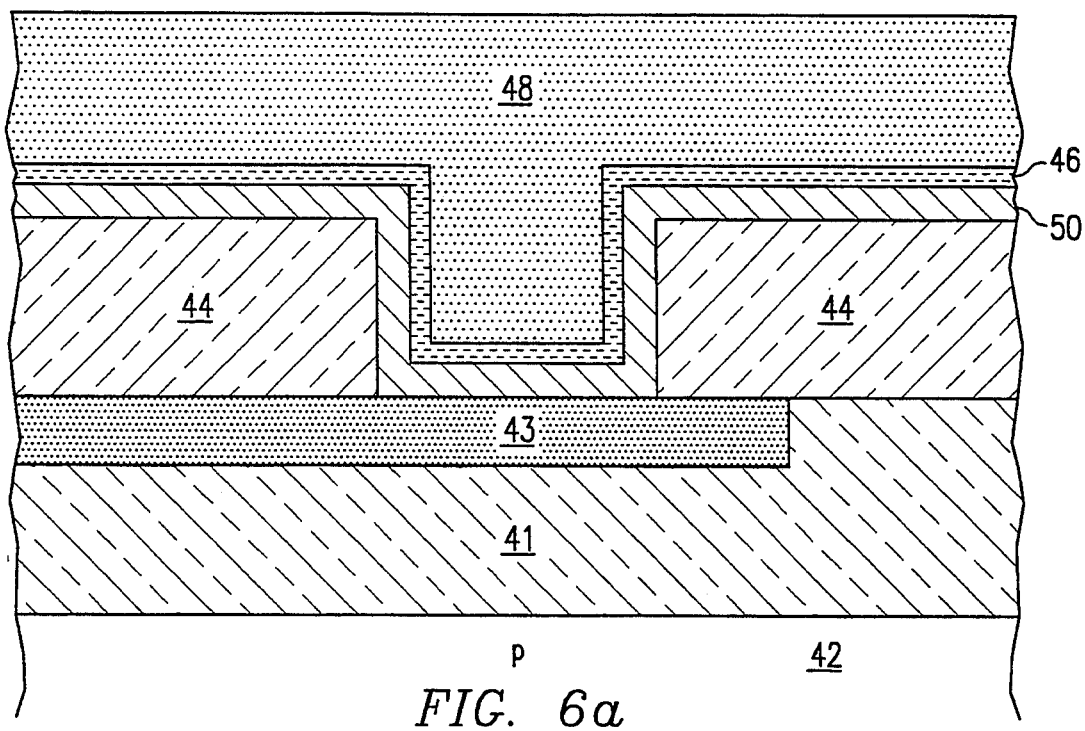
FIGS. 6a through 6c are cross-sectional views of the fabrication of an integrated circuit, at various steps, according to a third embodiment of the invention.
Figure 6B:
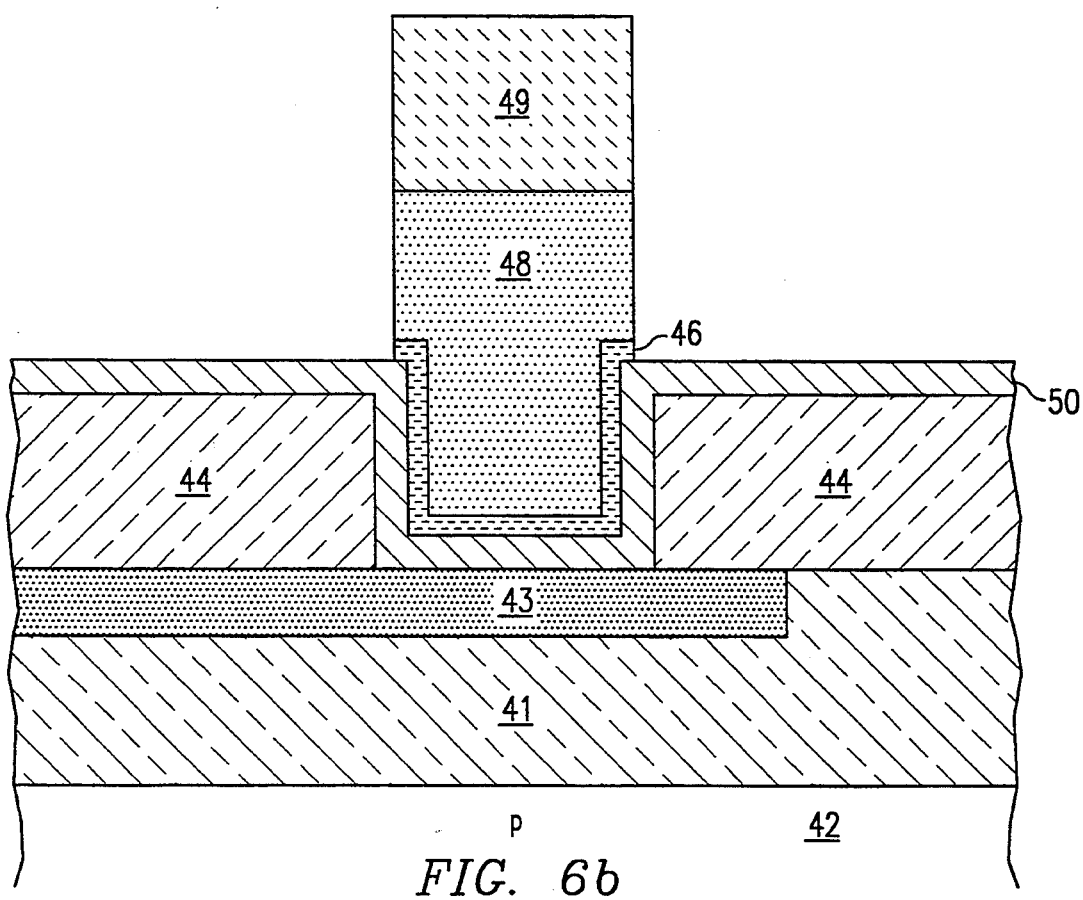
Figure 6C:
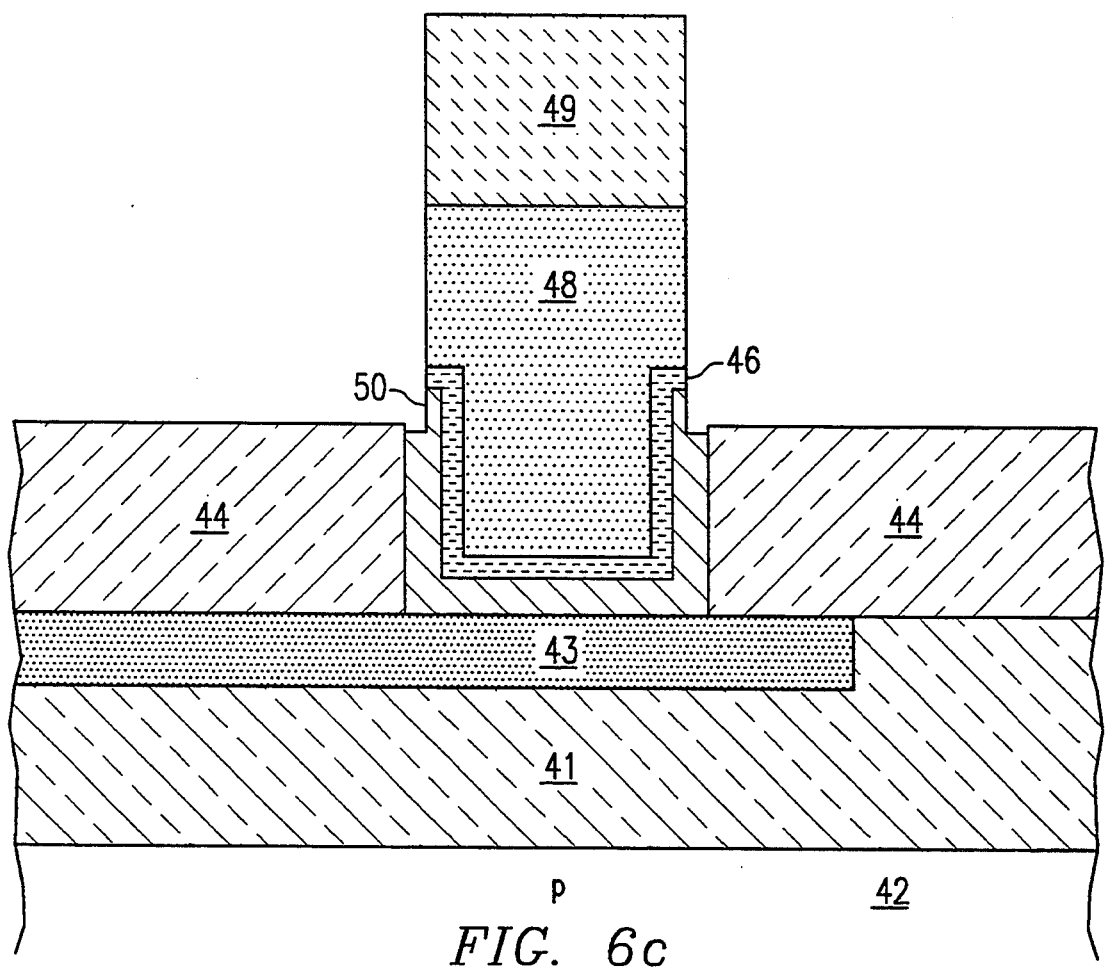

Referring now to FIGS. 6a through 6c, a third embodiment of the present invention will now be described. FIG. 6a illustrates a partially formed circuit, similar to FIGS. 3a and 5a discussed hereinabove, where a contact is to be made through insulating layer 44 to an electrode 43 disposed near the surface of the wafer. Electrode 43 is and insulated from p-type body 42 by an insulating layer 41, such as silicon dioxide. Electrode 43 may consist of doped polysilicon, metal (including aluminum) or other conductive electrodes as are known in the art. Also as described hereinabove, this embodiment of the invention is equivalently applicable to contacts to n-type or p-type semiconductor material such as diffused regions, as well as to overlying electrodes of other conductive material such as polysilicon. As in the example of FIG. 6a, insulating layer 44 is a conventional insulating layer known to those of ordinary skill in the art, such as silicon dioxide.

According to this embodiment of the invention, a first conductive layer 50 is formed by way of sputtering or chemical vapor deposition over the surface of the wafer after the formation of the contact opening. Conductive layer 50 consists of a material which is not significantly etched by the etchant used to etch overlying layers (including aluminum); preferred materials for conductive layer 50 include doped polysilicon, or refractory metals such as tungsten. Barrier layer 46, which is preferred by optional as noted hereinabove, is then sputtered or otherwise deposited over conductive layer 50, followed by the sputtering or other deposition of aluminum layer 48. The composition of barrier layer 46 and aluminum layer 48 is preferably as described hereinabove in the prior examples. Also as noted hereinabove, it is preferred that the deposition of conductive layer 50, barrier layer 46 and aluminum layer 48 be performed in-situ using multi-chamber processing equipment, to reduce wafer movement and native oxide formation.

Mask layer 49, for example developed photoresist or a hard mask such as silicon dioxide, is next formed over the portion of aluminum layer 48 at which the eventual metal line is to remain. Metal etch is then performed, again preferably using a relatively anisotropic conventional chlorine-based plasma etch which stops on conductive layer 50 of polysilicon, refractory metals, or other materials which are relatively impervious to the metal etch. Due to the etch stop characteristics of conductive layer 50, significant overetch at this step may be done, in order to ensure that the relatively thick aluminum layer 48 is cleared from the surface of the wafer.

Referring now to FIG. 6c, the formation of the metal line is completed by the removal of conductive layer 50, using mask layer 49 and aluminum layer 48 as a mask for this etch. It is preferable that the etch used to remove conductive layer 50 not significantly attack aluminum layer 48 or, if it does etch aluminum, that the etch be substantially anisotropic. In the case where conductive layer 50 is polysilicon, a preferred etch is a plasma etch using a chlorine-based chemistry (for example, where $BCl_3$ or $Cl_2$ is the active species); where conductive layer 50 is tungsten, plasma etch using a chlorine-based chemistry is also preferred. It is, of course, desirable that the etch of conductive layer 50 be done with an etchant which does not significantly attack insulating layer 44, as is the case for each of the above etchants, and such other etchants as are well known in the art.

For this embodiment of the invention also, zero enclosure spacing for the metal line outside of the contact opening is required. Indeed, mask layer 49 may be formed to have its edges within the contact opening, so long as the edges do not fall within the vertical portions of conductive layer 50 in the contact opening. As noted above, however, definition of mask layer 39 with exactly zero enclosure is preferred, to provide misalignment tolerance. According to this embodiment of the invention, since conductive layer 50 remains in the contact, it is of course desirable that it be as conductive as possible.

It should also be noted that each of the embodiments of the invention described hereinabove may be utilized as the top layer of metallization, or as lower levels of metallization in an integrated circuit having multilevel metallization. In the multilevel metallization case, contacts may be made among the various metallization layers in such a manner that the contacts are "stacked", one above the other, so that the top layer of metallization may make contact, via intermediate metallization layers, to single crystal silicon or other conductive regions of the device under all metallization.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit, comprising:
   a conductive element;
   an insulating layer overlying said conductive element, having a contact opening therethrough to expose a portion of said conductive element;
   etch stop material disposed within said contact opening, said etch stop material having a substantially lower etch rate to a selected etchant than the etch rate of aluminum to said selected etchant; and
   a metal layer, comprising aluminum, in electrical contact with said conductive element, disposed within said contact opening, and having an edge within the dimensions of said contact opening in such a manner that a portion of said etch stop material is exposed by said metal layer.

2. The integrated circuit of claim 1, further comprising:
   a lower metal layer, comprising aluminum, disposed within said contact opening between said etch stop material therewithin and said conductive element, said lower metal layer also having a portion exposed by said metal layer and said etch stop material.

3. The integrated circuit of claim 2, further comprising:
   a barrier layer disposed within said contact opening between said lower metal layer and said conductive element.

4. The integrated circuit of claim 1, wherein said etch stop material is disposed along the sidewalls of said contact opening.

5. The integrated circuit of claim 4, wherein said etch stop material comprises a semiconductor.

6. The integrated circuit of claim 4, wherein said etch stop material is electrically conductive.

7. The integrated circuit of claim 6, wherein said etch stop material is also disposed between said metal layer and said conductive element.

8. The integrated circuit of claim 7, wherein said etch stop material is in contact with said conductive element.

* * * * *